United States Patent [19]

Angerstein

[11] 4,227,297
[45] Oct. 14, 1980

[54] METHOD FOR PRODUCING A SINGLE TRANSISTOR STORAGE CELL

[75] Inventor: Joerg Angerstein, Flein, Fed. Rep. of Germany

[73] Assignee: Siemens Aktiengesellschaft, Berlin & Munich, Fed. Rep. of Germany

[21] Appl. No.: 929,787

[22] Filed: Jul. 31, 1978

[30] Foreign Application Priority Data

Aug. 23, 1977 [DE] Fed. Rep. of Germany ....... 2738008

[51] Int. Cl.$^3$ ............................................. B01J 17/00
[52] U.S. Cl. ....................................... 29/571; 29/578; 29/580
[58] Field of Search .......................... 29/571, 578, 580

[56] References Cited

U.S. PATENT DOCUMENTS

| 3,930,300 | 1/1976 | Nicolay | 29/571 |
| 4,065,783 | 12/1977 | Ouyang | 357/23 |

*Primary Examiner*—W. C. Tupman
*Attorney, Agent, or Firm*—Hill, Van Santen, Steadman, Chiara & Simpson

[57] ABSTRACT

For the production of V-MOS single transistor storage cells at the surface of a silicon crystal of first conductivity type, two adjoining zones of opposite conductivity type can first be produced by masked diffusion or implantation. Then, with the use of a correspondingly oriented etching mask, a funnel-shaped depression is produced at the semiconductor surface such that the two zones of opposite conductivity type are separated from one another but reach the surface of the silicon crystal within the funnel-shaped depression. This depression is then coated with a thin SiO$_2$ layer which is provided as a carrier of the gate electrode of the field effect transistor which forms the storage cell. The two zones of the opposite conductivity type, now separated, are used as a source and as a drain and also as a storage capacitance. For geometric reasons, the two zones of opposite conductivity type can only be produced one after the other with the use of corresponding doping masks. A mask is additionally required in order to produce the funnel-shaped depression. The masks must be carefully adjusted in relation to one another. In order to eliminate the need for an additional mask, one of the masks used for the production of the zones of opposite conductivity type is employed without change as an etching mask for the production of the funnel-shaped depression. The layer forming the doping mask must then, in addition to its impermeability for the doping material utilized, also be resistant against the etching compound to be utilized.

8 Claims, 3 Drawing Figures

Fig.1
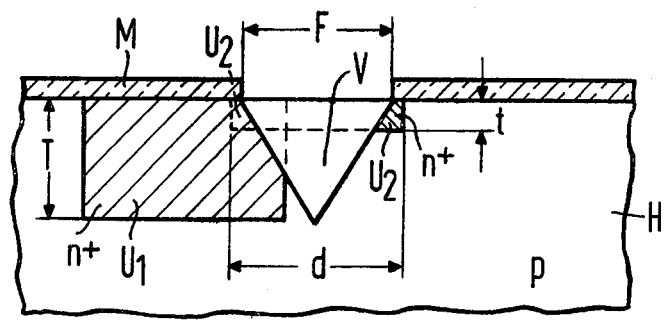
Fig.2
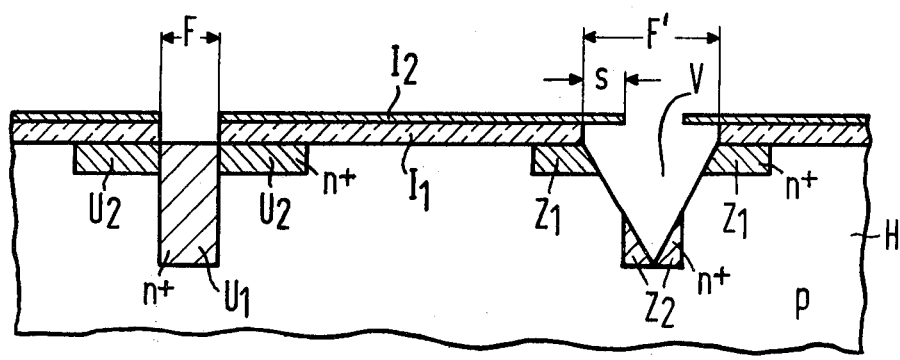
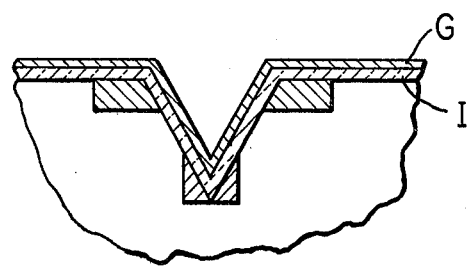
Fig.2a

METHOD FOR PRODUCING A SINGLE TRANSISTOR STORAGE CELL

BACKGROUND OF THE INVENTION

A method for producing a single transistor storage cell is disclosed in the pending patent application of Kurt Hoffmann, "Process for the Production of a Single Transistor Memory Cell", Ser. No. 934,263 filed Aug. 16, 1978, and incorporated herein by reference. In a semiconductor crystal of first conductivity type, two zones of the opposite conductivity type and separated by a strip or portion of first conductivity type are produced as well as a depression limited in depth by converging plane surfaces situated in the region of these two zones. The two zones within the depression are produced such that they reach the semiconductor surface. Also, the pn junctions of the two zones are designed differently in relation to the portion of the semiconductor crystal exhibiting the original conductivity type such that the capacitance of the storage cell to be produced is at least predominantly provided by only one of the two pn junctions. Finally, within the depression or recess, an insulating layer is provided whereon a gate electrode, capacitively controlling the two pn junctions is provided. On a plane portion of the surface of the semiconductor crystal, first two continuous zones with different depths and of conductivity type opposite to that of the semiconductor crystal are produced and then the depression is produced at the same portion of the semiconductor surface such that the two zones are separated from one another by the depression.

Such a method is used for producing a V-MOS single transistor storage cell, known per se. Such a storage cell merely consists of a MOS-field effect transistor produced in a depression or recess of the semiconductor surface which exhibits a V-shaped profile. Due to this technique, the store cell requires little space and therefore permits the production of storage matrices with a high bit-density. The method described in the Hoffmann application now has the objective to simplify the method known for the production of V-MOS transistors operating with an epitaxial deposition of semiconductor material such that the epitaxy can be spared.

A preferred embodiment of the method mentioned proceeds such that an area A is brought into contact with a doping material which produces the opposite conductivity type in relation to that of the semiconductor crystal at a plane surface portion of the semiconductor crystal such that the doping material there effects a re-doping of the semiconductor crystal to a depth T while forming a re-doped area $U_1$ corresponding with the shape and magnitude of area A. Moreover, a second area B adjoining the area A from the exterior is brought into contact with a doping material producing the opposite conductivity type in relation to that of the semiconductor crystal such that the doping material there effects a re-doping of the semiconductor crystal to a depth of $t<T$ while forming re-doped area $U_2$ determined by the shape and size of area B. Finally, the depression V is produced in the areas A and B of the semiconductor surface such that at least two separate zones $Z_1$ and $Z_2$ are formed from the re-doped areas $U_1$ and $U_2$. One of the zones reaches the semiconductor surface in the depression V alongside of its edge and the other zone reaches the depression approximately at its deepest point.

The following variations of this method are additionally important for the following illustrations:

1. The area A has the shape of a square or retangle, and the area B has the shape of a strip adjoining the area A all around and having the same width, and the depression V has the shape of a reversed square pyramid whose edge surrounds the area A in parallel to its borders within the area B.
2. The area A has the shape of a rectangular strip. Additionally, pairs of areas B are provided such that the areas B also of a square or rectangular design can be represented on one another by mirroring with respect to the longitudinal symmetrical axis of area A, so that one edge of each of the areas B coincides with one portion of the longitudinal edge of area A. Two possibilities concerning the production of the depression V exist here:

(a) A depression V, having the shape of a reversed pyramid, is produced per area pair B such that the depression V orthogonally intersects the area A with two edges.

(b) A depression V, exhibiting the shape of a symmetrical reversed roof and having a length which is at least equal the length of area A, is produced and oriented in relation to the areas A and B such that the two edges of the depression V are in the areas B in parallel to the symmetrical axis of area A.

Details regarding the production of the depressions having the V-shaped converging limiting walls are contained in the Hoffmann application. At this point it is noted that the etching velocity is different in accordance with the various directions in the semiconductor crystal. This etching velocity thus behaves like a tensor, and that with a suitable orientation of the crystal surface in relation to the (111)-planes of the semiconductor grid and with corresponding orientation of the windows of the etching masks and also with the utilization of a not too rapidly working etching means, such depressions V are spontaneously formed. A suitably oriented crystal surface is identical with a (100)-plane in semiconductor materials crystallizing in accordance with the diamond grid or grids related thereto, whereas the etching masks to be utilized for the production of the depressions are designed such that the edges of their windows run in parallel to the (111)-planes. A suitable etching compound for the production of the depression is, for example, thinned KOH. A correspondingly perforated $SiO_2$ layer can be used as the etching mask, for example, and which is applied on the surface of the semiconductor crystal, for example, by means of sputtering-on. The surface of the crystal is provided with the corresponding windows with the aid of a known photolacquer etching technique.

SUMMARY OF THE INVENTION

It is an objective of the invention to further develop the method described above.

A doping mask, used for the production of one of the two zones, is simultaneously used as an etching mask in order to produce the depressions at the location of the zone which was produced with the aid of said doping mask.

BRIEF DESCRIPTION OF THE DRAWINGS

FIG. 1 illustrates in cross-section a method of the invention;

FIG. 2 shows a further development of the method of the invention illustrated in FIG. 1; and FIG. 2a is a fragmentary view showing the addition of the gate on the semi-conductor storage transistor of FIG. 2.

DESCRIPTION OF THE PREFERRED EMBODIMENTS

In the method first to be described in accordance with the invention, the depression or recess is produced at the location of one of the two zones of opposite conductivity type which projects less deeply into the semiconductor crystal. A diffusion mask is utilized which is resistant to the etching compound to be utilized for the production of the depression into the semiconductor crystal. If thinned alkali caustic solution, for example, KOH or RbOH is utilized as an etching compound, a correspondingly perforated $SiO_2$-layer can be used as an etching mask and which contains as little doping material as possible. The $SiO_2$ layer can be applied, for example, by means of pyrolytic deposition from a hydrosilicon-oxygen mixture thinned with argon, or by means of sputtering-on, and can be provided with the necessary doping windows with the aid of a photolacquer etching technique.

At the surface of a p-conductive silicon monocrystal H (FIG. 1), a n+-doped zone $U_1$ is applied to a depth T into the semiconductor crystal H. This zone $U_1$ is produced by masked diffusion or implantation of donor material. A flatter re-doped zone $U_2$, using a second doping mask M, if formed which partially projects into the area of the re-doped zone $U_1$ or which at least borders said zone. The diffusion mask M consists, for example, of pure $SiO_2$.

According to the teachings of the invention, the doping window which was utilized for the production of the second zone $U_2$ exhibiting the lesser depth t, is now utilized in the production of recess or depression V for limiting the effect of the etching compound.

If the semiconductor surface on which the depression V was produced coincides now with a (100)-plane of the silicon grid, this surface meets the (111)-planes at an angle whose cotangent has the value of "$\sqrt{2}$". If the dimension of the depression is now to be determined by the diffusion window, care has to be taken that the depth t by which zone $U_2$ was produced satisfies the relation $$t < l < d \cdot \sqrt{2}$$

where d represents the smaller dimension of the rectangular-shaped or square doping window F. Then λ represents the depth of the V-shaped depression.

It is now particularly advantageous, as illustrated with the aid of FIG. 2, if the depression V is produced at the location of the one of the two zones of opposite conductivity type which projects deeper into the semiconductor crystal, the doping mask utilized for the production of said zone may be utilized for producing the depression V. It is preferred that the flatter of the two zones of opposite conductivity type is designed symmetrically in relation to the deeper of said two zones. It is preferred that one first produces the flatter zone $U_2$ and only then the deeper zone $U_1$, that a doping mask M consisting of two layers of insulating material arranged one atop the other, is utilized for the production of the deeper zone, and that the material of the lower insulating layer $I_1$ is selected such that it can be selectively etched by a medium which neither attacks the material of the upper insulating layer $I_2$ nor the semiconductor material. Utilizing the upper insulating layer as an etching mask and using a medium such as described, the doping window in the lower insulating layer is enlarged sufficiently so that the etching liquid to be used for producing the depression V is capable, without under-etching the first insulating layer $I_1$ utilized as the etching mask, of producing a depression V sufficient for the separation of the two zones.

The execution of the method becomes clearly understandable with the aid of FIG. 2. After producing the flatter zone $U_2$ and subsequently the deeper zone $U_1$ utilizing the two insulating layers $I_1$ and $I_2$, the situation visible from the left half of the figure is first provided. If the etching liquid had only the area of the silicon surface lying free in the unaltered doping window available, a depression V sufficient for the separation of the two zones $U_1$ and $U_2$ could only form with the use of a correspondingly strong under-etching of the insulating layer $I_1$ utilized as the etching mask in this process. If, however, a widening of the doping window to be provided is to be well controlled by the etching time and the capillary effect of the upper insulating layer $I_2$ and of the semiconductor surface, then the doping window F', thus widened, is utilized for limiting the etching effect during production of depression V, and the problem is removed.

If t represents the depth of the latter zone $U_2$, and T represents the depth of the other zone $U_1$ with the assumption that the semiconductor surface is a (100)-plane, the amount of underetching of the upper insulating layer $I_2$ and thus the amount of widening of the doping window F utilized for producing zone $U_1$ is to be apportioned such that the relation $$t \cdot \sqrt{2} < s < T \cdot \sqrt{2}$$

is fulfilled. These relationships hold true independently whether zones $U_1$ and $U_2$ are rectangular or square.

As a material for insulating layer $I_1$, the alkaline etching compound $SiO_2$ to be utilized for the etching of depressions V is again used. The upper insulating layer $I_2$, however, preferably consists of silicon nitride which is applied either by sputtering-on or by pyrolytic deposition from a suitable reaction gas, for example, a mixture of $SiH_4$ and $NH_3$, thinned with an inert gas. For the widening of doping window F, buffered hydrofluoric acid is expediently utilized. In order to control the etching which is used for producing the widening of doping window F, the etching speed is determined by fixing the treatment temperature at a constant value so that the extent of the widening s to be produced can be determined by the etching time.

The essential advantage of the method described with the aid of FIG. 2 lies primarily in that the channel length of the field effect transistor representing the storage cell is no longer dependent upon the adjustment of the doping mask utilized for producing zone $U_1$ and also utilized for producing zone $U_2$.

The right half of FIG. 2 illustrates now the outline of depression V obtained by a correspondingly widened window F'. The portions $Z_1$ and $Z_2$ situated outside of the depression then form the two zones of the single transistor storage cell to be produced. The cell is then to be completed in the manner shown in the application Ser. No. 934,263. That is, a gate electrode G insulated from the substrate and zones by an insulating layer I is provided in depression V and also with corresponding connections of the two zones $Z_1$ and $Z_2$. If the deepest point of depression V extends beyond the deepest point of zone $U_1$ and if zone $U_1$ is elongated, two zones $Z_2$ are formed from the re-doped zone $U_2$ which can be used as bit lines. Zone $Z_1$ formed from the re-doped zone $U_2$ and exhibiting the larger area of the pn junction which limits said zone, however, forms the capacitance of the storage cell.

Although various minor modifications may be suggested by those versed in the art, it should be understood that I wish to embody within the scope of the patent warranted hereon, all such embodiments as reasonably and properly come within the scope of my contribution to the art.

I claim as my invention:

1. A method for producing a single transistor storage cell, comprising the steps of:
   (a) providing a semiconductor body of first conductivity type and having a major surface;
   (b) doping a first zone of second conductivity type opposite to the first conductivity type from said major surface into the semiconductor body to a given depth;
   (c) doping through a doping mask window on the major surface a second zone of second conductivity type adjacent and having a contiguous portion with the first zone but to a different depth than the first zone, one of the zones being dimensioned so as to form a pn junction with the semiconductor body which is substantially shorter than a pn junction of the other zone after a V-shaped gate recess is subsequently etched so that a capacitance of the completed storage cell is predominantly provided by the zone with the longer pn junction;
   (d) anisotropically etching the V-shaped gate recess by use of the same doping mask window into said second zone, said contiguous portion with the first zone, a portion of the first zone, and a portion of the semiconductor body so as to separate unetched portions of the first and second zones by part of the semiconductor body; and
   (e) applying a gate insulation layer and a gate electrode in the V-shaped recess.

2. A method for producing a single transistor storage cell, comprising the steps of:
   (a) providing a semiconductor body of first conductivity type and having a major surface;
   (b) doping a first zone of second conductivity type opposite to the first conductivity type from said major surface into the semiconductor body to a given depth;
   (c) doping through a doping mask window on the major surface a second zone of second conductivity type adjacent and having a contiguous portion with the first zone and to a depth less than the first zone, one of the zones being dimensioned so as to form a pn junction with the semiconductor body which is substantially shorter than a pn junction of the other zone so that after a V-shaped gate recess is subsequently etched a capacitance of the completed storage cell is predominantly provided by the zone with the longer pn junction;
   (d) anisotropically etching the V-shaped gate recess by use of the same doping mask window into said second zone, said contiguous portion with the first zone, a portion of the first zone, and a portion of the semiconductor body so as to separate unetched portions of the first and second zones by part of the semiconductor body; and
   (e) applying a gate insulation layer and a gate electrode in the V-shaped recess.

3. A method in accordance with claim 1 including the step of utilizing a thinned alkali caustic solution as an etching compound in order to produce the recess.

4. A method for producing a single transistor storage cell, comprising the steps of:
   (a) providing a semiconductor body of first conductivity type and having a major surface;
   (b) doping a first zone of second conductivity type opposite to the first conductivity type from said major surface into the semiconductor body to a given depth;
   (c) providing upper and lower insulating layers on the major surface as a doping mask and doping through a window therein a second zone of second conductivity type adjacent and having a contiguous portion with the first zone but to a greater depth, one of the zones being dimensioned so as to form a pn junction with the semiconductor body which is substantially shorter than a pn junction of the other zone after a V-shaped gate recess is subsequently etched so that a capacitance of the completed storage cell is predominantly provided by the zone with the longer pn junction;
   (d) enlarging the window in the lower layer and anisotropically etching the V-shaped gate recess through the window in the upper layer and the enlarged window in the lower layer into said second zone, said contiguous portion with the first zone, a portion of the first zone, and a portion of the semiconductor body so as to separate unetched portions of the first and second zones by part of the semiconductor body; and
   (e) applying a gate insulation layer and a gate electrode in the V-shaped recess.

5. A method in accordance with claim 4 including the step of utilizing a thinned alkali caustic solution as an etching compound in order to produce the recess.

6. A method in accordance with claim 4 including the steps of producing the first zone such that it has portions contiguous with the second zone on opposite sides thereof.

7. A method according to claim 4 including the steps of providing the lower insulating layer with a material which can be selectively etched with a medium which attacks neither the upper layer nor the semiconductor body and enlarging the window in the lower layer with said medium.

8. A method in accordance with claim 6 including the step of providing the lower insulating layer as $SiO_2$, providing the upper layer as $Si_3N_4$, providing the etching medium to be utilized for widening the doping window in the lower insulating layer as a buffered hydrofluoric acid, and providing an etching medium utilized for producing the recess as a thinned alkali caustic solution.

* * * * *